United States Patent
Danon et al.

(10) Patent No.: US 10,141,065 B1
(45) Date of Patent: Nov. 27, 2018

(54) ROW REDUNDANCY WITH DISTRIBUTED SECTORS

(71) Applicant: Cypress Semiconductor Corporation, San Jose, CA (US)

(72) Inventors: Kobi Danon, Te-Aviv (IL); Yoram Betser, Mazkeret Batya (IL); Uri Kotlicki, Ramat Gan (IL); Arieh Feldman, Yokne'am Illit (IL)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/850,779

(22) Filed: Dec. 21, 2017

Related U.S. Application Data (60) Provisional application No. 62/551,314, filed on Aug. 29, 2017.

(51) Int. Cl.
| | |
|---|---|
| *G11C 16/06* | (2006.01) |
| *G11C 16/34* | (2006.01) |
| *G11C 29/00* | (2006.01) |
| *G11C 29/44* | (2006.01) |
| *G11C 16/14* | (2006.01) |

(52) U.S. Cl.
CPC .......... *G11C 16/3445* (2013.01); *G11C 16/14* (2013.01); *G11C 29/4401* (2013.01); *G11C 29/70* (2013.01)

(58) Field of Classification Search
CPC . G11C 16/3445; G11C 16/14; G11C 29/4401; G11C 29/70
See application file for complete search history.

(56) References Cited

U.S. PATENT DOCUMENTS

| | | | | |
|---|---|---|---|---|
| 6,172,906 B1 * | 1/2001 | Estakhri | ............... | G06F 3/0613 365/185.11 |
| 6,397,313 B1 * | 5/2002 | Kasa | ................... | G11C 29/781 365/200 |
| 6,751,121 B2 | 6/2004 | Marotta | | |
| 6,944,072 B2 | 9/2005 | Micheloni et al. | | |
| 7,061,816 B2 | 6/2006 | Sugiura et al. | | |
| 7,406,620 B2 | 7/2008 | Shubat et al. | | |
| 7,590,001 B2 * | 9/2009 | Janai | ..................... | G11C 29/70 365/185.09 |
| 7,609,569 B2 | 10/2009 | Fragano et al. | | |
| 7,613,042 B2 | 11/2009 | Zhang et al. | | |

(Continued)

FOREIGN PATENT DOCUMENTS

| | | |
|---|---|---|
| KR | 100375998 B1 | 3/2003 |
| WO | 1996036050 A1 | 11/1996 |

OTHER PUBLICATIONS

Favre, Simon, "Addressing Critical-Area Analysis and Memory Redundancy," EDN Network, Mar. 1, 2012, pp. 1-7; 7 pages.

(Continued)

*Primary Examiner* — Pho M Luu (57) ABSTRACT

A semiconductor device comprises an embedded flash memory with row redundancy. The embedded flash memory comprises a memory bank that includes multiple physical sectors, where each physical sector comprises a plurality of erase sectors. In the memory bank, multiple portions of an additional erase sector are respectively distributed among the multiple physical sectors. The multiple portions of the additional erase sector are configured as a row-redundancy sector for the memory bank.

20 Claims, 5 Drawing Sheets

(56) References Cited

U.S. PATENT DOCUMENTS

| | | | |
|---|---|---|---|
| 8,339,865 B2 | 12/2012 | Lavan et al. | |
| 8,730,729 B2 * | 5/2014 | Weingarten | G06F 11/1068 365/185.12 |
| 9,728,269 B2 | 8/2017 | Park et al. | |
| 9,741,421 B1 | 8/2017 | Hedden | |
| 2015/0193204 A1 | 7/2015 | Lin et al. | |
| 2015/0323969 A1 | 11/2015 | Hsu et al. | |

OTHER PUBLICATIONS

International Search Report for International Application No. PCT/US18/45223 dated Sep. 6, 2018; 3 pages.
Written Opinion of the International Searching Authority for International Application No. PCT/US18/45223 dated Sep. 6, 2018; 6 pages.

* cited by examiner

ROW REDUNDANCY WITH DISTRIBUTED SECTORS

PRIORITY

This application claims priority to U.S. Provisional Application No. 62/551,314, filed on Aug. 29, 2017, the entire content of which is incorporated by reference herein.

TECHNICAL FIELD

This disclosure generally relates to non-volatile memory devices and, in particular, to providing hardware row redundancy in flash memory.

BACKGROUND

Non-volatile memories, such as flash memories, are widely used for storing data and instructions in computing devices. A flash memory typically includes one or more memory banks of physical sectors having memory cells arranged in rows and columns. Some semiconductor devices, such as microcontrollers, may include a flash memory that is embedded therein on the same semiconductor chip.

It is desirable to provide embedded flash memories with row redundancy for post-manufacture correction of manufacturing defects, but implementing such row redundancy in an efficient manner is not trivial. For example, in some applications the amount of the required row redundancy is the size of one quarter of a physical sector. However, adding such small amount of flash memory to each memory bank requires the use of an isolated physical sector having a small non-standard size, but this incurs a large overhead in terms of die area. This is because X-decoders and Y-decoders of normal size are necessary to perform memory operations on the small non-standard physical sector, and such normal X-decoders and Y-decoders occupy a die area of the same size as the decoders needed to operate the normal physical sectors.

DETAILED DESCRIPTION

The following description sets forth numerous specific details such as examples of specific systems, components, methods, and so forth, in order to provide a good understanding of various embodiments of the techniques described herein for distributed row redundancy in flash memory. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment", "one embodiment", "an example embodiment", "some embodiments", and "various embodiments" means that a particular feature, structure, or characteristic described in connection with the embodiment(s) is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description and in which similar reference numbers may refer to similar components or operations. The drawings show illustrations in accordance with exemplary embodiments. These embodiments, which may also be referred to herein as "examples", are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the described subject matter but rather to enable one skilled in the art to practice, make, and/or use such subject matter.

Flash memory, such as embedded flash, is typically required to have some amount of row-redundancy memory cells that can replace memory cells with manufacturing defects which are row-related (e.g., such as defects along the X-direction in a memory cell array). The amount of the necessary row redundancy may be determined based on various manufacturing parameters, such as yield analysis, physical sector size, etc. In some applications, the standard requirement is to have at least one erase sector (e.g., per a ~1 MB memory bank) for post-manufacture replacement of a defectively manufactured erase sectors, where four erase sectors may comprise one physical sector in the memory bank. If a row-related defect is found post-manufacture in an erase sector during a sort flow operation, the defective erase sector must be replaced with redundant sector select gate (SG) lines (also referred to as word lines, or WLs), memory gate (MG) lines, and source lines (SLs) for all flash operations (e.g., program, erase, verify and read). A sort flow operation is a post-manufacturing operation that can be performed by test probes and other manufacturing equipment on a die while it is still on the wafer, when the die is disposed in a package, or at any other time before the package is shipped out to a customer. The defects that can be detected by a sort flow operation may depend on the manufacturing technology, and row-related defects may include MG-to-MG shorts, SG-to-SG shorts, MG-to-SL shorts, MG-to-BL (bit line) shorts, MG opens, SG opens, and SL opens, among others.

Figure 1:
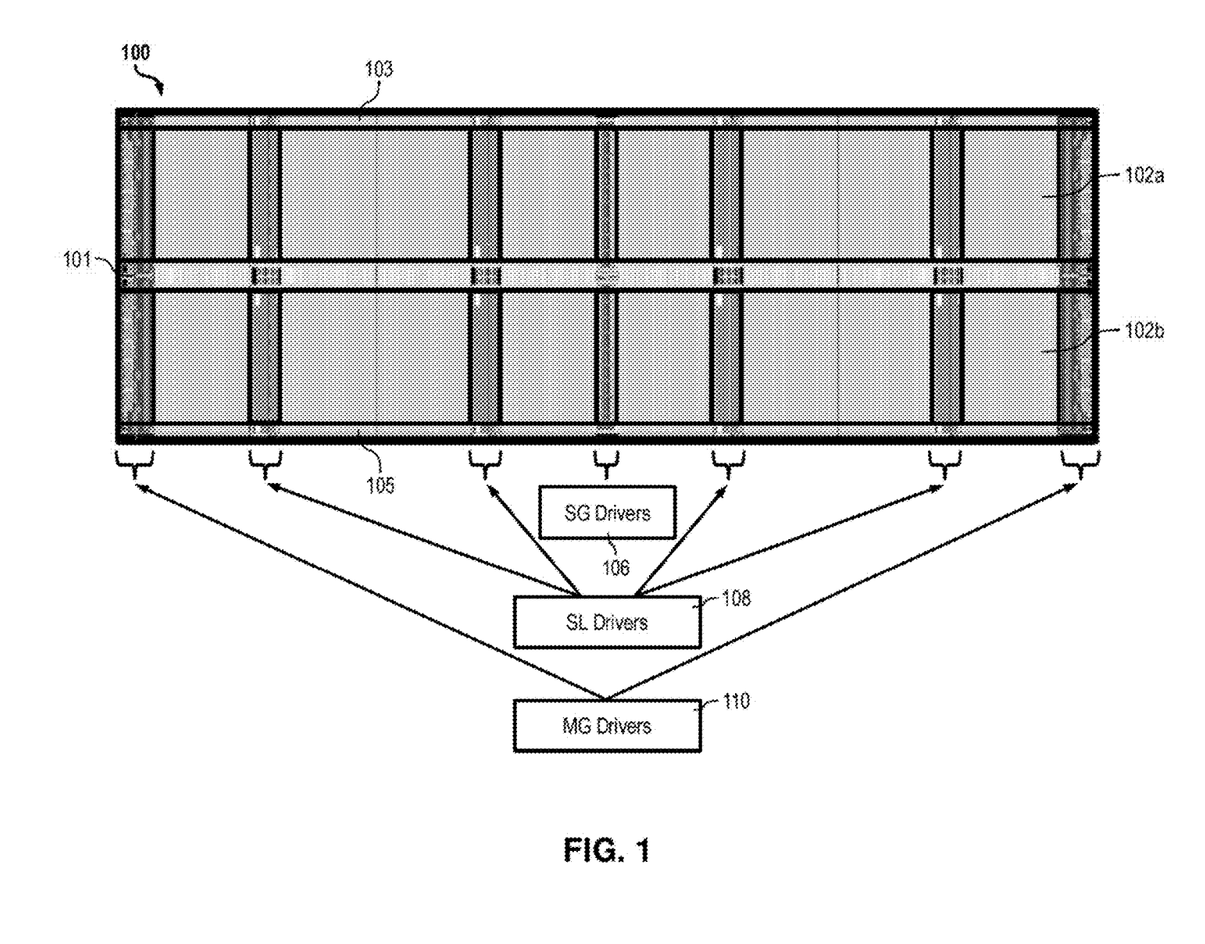
FIG. 1 is a block diagram illustrating an example die layout of an ×2 physical sector structure, according to some embodiments.

The challenge in adding row redundancy is to minimize the die area penalty. For example, some applications may use an ×2 structure of physical sectors, meaning that a physical sector cannot be added on its own but it must have its adjacent sector added as well. The reason is that memory read operations are performed using local differential sense amplifiers (SAs), which use reference currents provided from reference cells located on the adjacent physical sector. For example, such ×2 structure may be preferred in applications that require memory access to one physical sector at a time because the same set of SAs can be used for two physical sectors, thereby saving die area that would otherwise be necessary if each physical sector has its own SAs. FIG. 1 is a block diagram illustrating a die layout of such ×2 physical sector structure according to some embodiments.

In FIG. 1, ×2 structure 100 includes a core area with flash memory cells and die areas 101, 103, and 105, which are essentially a "periphery" die-area overhead. Die area 101 is disposed between two adjacent physical sectors, 102a and 102b, each of which includes core areas with flash memory cells arranged in rows and columns. A flash memory cell typically includes a select gate, a memory gate, and one or more memory transistors disposed over a channel formed in an integrated circuit (IC) substrate between a source region and a drain region on the substrate. Die area 101 houses the local SAs (which operate on both physical sectors 102a and 102b) and the circuitry that is configured to select the top (both odd and even) SG lines. Die area 103 houses the circuitry to select the bottom/even SG lines, and die area 105 houses the circuitry to select the bottom/odd SG lines. ×2 structure 100 also includes SG drivers 106, SL drivers 108, and MG drivers 110. A driver is a circuit of electronic elements (e.g., transistors, diodes, logic gates, etc.) configured to apply certain voltages and/or currents on other electronic elements or components (e.g., conductive lines, memory cells, etc.) coupled thereto. In FIG. 1, SG drivers 106 are configured to drive SG lines (also referred to as word lines) that are coupled to the select gates of memory cells in physical sectors 102a and 102b. SL drivers 108 are configured to drive source lines coupled to the source regions of memory cells in physical sectors 102a and 102b. MG drivers 110 are configured to drive MG lines coupled to the memory gates of memory cells in physical sectors 102a and 102b. It should be appreciated that on the die, the pitch of the semiconductor elements in the various drivers is larger than the pitch at which flash memory cells are disposed in the core areas of physical sectors 102a and 102b.

One conventional approach for implementing row redundancy is the addition of a dedicated physical sector to the memory array. For example, in applications that use an ×2 physical sector structure (e.g., as shown in FIG. 1), the proper amount of WLs needed to replace one erase sector needs to be added as a separate (albeit small) physical sector. There are two problems with this approach. First, the peripheral circuitry (e.g., the SAs and the select elements) required for an ×2 physical sector structure needs to be added separately from the peripheral circuitry used to operate the core flash memory cells. Second, the number of WLs in a dedicated row-redundant sector is only a ¼ of a normal physical sector. Both of these problems impose a big layout problem for the X-decoders (e.g., with the SG, SL, and MG drivers included therein) since the sector height of the dedicated sector is only a ¼ of a normal sector and there is not enough width to fit the MG and SL drivers shown in FIG. 1. This results in an increased width of the decoders, which impacts the width of the entire array. While for a normal physical sector the sharing of MG and SL drivers could be extensive (thereby reducing the total width of the X-decoder), the sharing options for the dedicated row-redundant sector are limited and result in a wider X-decoder.

To address these and other problems, described herein are various embodiments of techniques for distributed row redundancy in flash memory. In these embodiments, the solution to the above problems is to distribute the row redundancy (RR) WLs within multiple of the normal physical sectors, such that the total size of the memory cells coupled to the RR WLs is equal to the size of at least one erase sector that would be used as a row-redundancy sector. When the row-redundancy sector is actually configured to replace a defective erase sector, the memory operations will access the same normal physical sectors but with different decoded address targets, which would point to the memory cells coupled to the RR WLs in the distributed row-redundancy sector. In this manner, the distributed row-redundancy techniques described herein will use the same set of decoding and auxiliary circuitry that is used for the normal physical sectors. For example, the X-decoders (e.g., with their SG, MG and SL drivers), the select Y-decoding transistors, and the SAs that are used for the normal physical sectors will share the same die area as the X-decoders that are used to choose the RR WLs in the distributed row-redundancy sector. This results in a significant saving of die area and in a robust redundancy scheme.

In one example embodiment, a semiconductor device comprises an embedded flash memory that includes a memory bank with multiple physical sectors. Each physical sector comprises a plurality of erase sectors, where multiple portions of an additional erase sector are respectively distributed among the multiple physical sectors, and the multiple portions of the additional erase sector are configured as a row-redundancy sector for the memory bank. In one aspect of this embodiment, the memory bank includes a defective erase sector (e.g., which may be determined during a sort flow operation on the embedded flash memory), and the multiple portions of the additional erase sector are configured to replace the defective erase sector within the memory bank. In an example aspect, the embedded flash memory is configured to access the multiple portions of the additional erase sector, instead of the defective erase sector, during a memory operation on the memory bank. The memory operation may be, for example, a read operation or a program operation. The memory operation may also be an erase operation that is performed serially, or in parallel, on the multiple physical sectors to erase each of the multiple portions of the additional erase sector. In one aspect, the semiconductor device comprises first WLs coupled to first memory cells in the multiple physical sectors, and second WLs distributed among the multiple physical sectors in addition to the first WLs, where the second WLs are coupled to second memory cells in the multiple portions of the additional erase sector. In another aspect, in addition to the multiple physical sectors, the memory bank comprises one or more physical sectors that do not include a portion of the additional erase sector.

In another example embodiment, a system comprises a microcontroller and a flash memory embedded within the microcontroller. The flash memory comprises a memory bank that includes multiple physical sectors. Each physical sector comprises a plurality of erase sectors, where multiple portions of an additional erase sector are respectively distributed among the multiple physical sectors, and the multiple portions of the additional erase sector are configured as a row-redundancy sector for the memory bank. In one aspect of this embodiment, the memory bank includes a defective erase sector (e.g., which may be determined during a sort flow operation on the embedded flash memory), and the multiple portions of the additional erase sector are configured to replace the defective erase sector within the memory bank. In an example aspect, the flash memory is configured to access the multiple portions of the additional erase sector, instead of the defective erase sector, during a memory operation on the memory bank. The memory operation may be, for example, a read operation or a program operation. The memory operation may also be an erase operation that is performed serially, or in parallel, on the multiple physical sectors to erase each of the multiple portions of the additional erase sector.

In another example embodiment, a method of configuring embedded flash memory with row redundancy comprises: providing first WLs disposed in multiple physical sectors of a memory bank in the embedded flash memory, where each physical sector comprises a plurality of erase sectors; and providing second WLs disposed within the multiple physical sectors in addition to the first WLs, where the second WLs are configured to form multiple portions of an additional erase sector that are respectively distributed among the multiple physical sectors, and where the additional erase sector is configured as a row-redundancy sector for the memory bank. In one aspect of this embodiment, the method further comprises: determining (e.g., during a sort flow operation on the embedded flash memory) that the memory bank includes a defective erase sector; and configuring the embedded flash memory to replace the defective erase sector with the multiple portions of the additional erase sector in the memory bank. In an example aspect, the method may further comprise configuring the embedded flash memory for a memory operation (e.g., a read or a program operation) that is to access the multiple portions of the additional erase sector instead of the defective erase sector. In another example aspect, the method may further comprise configuring the embedded flash memory for an erase operation that is to be performed serially, or in parallel, on the multiple physical sectors to erase each of the multiple portions of the additional erase sector.

Figure 2:
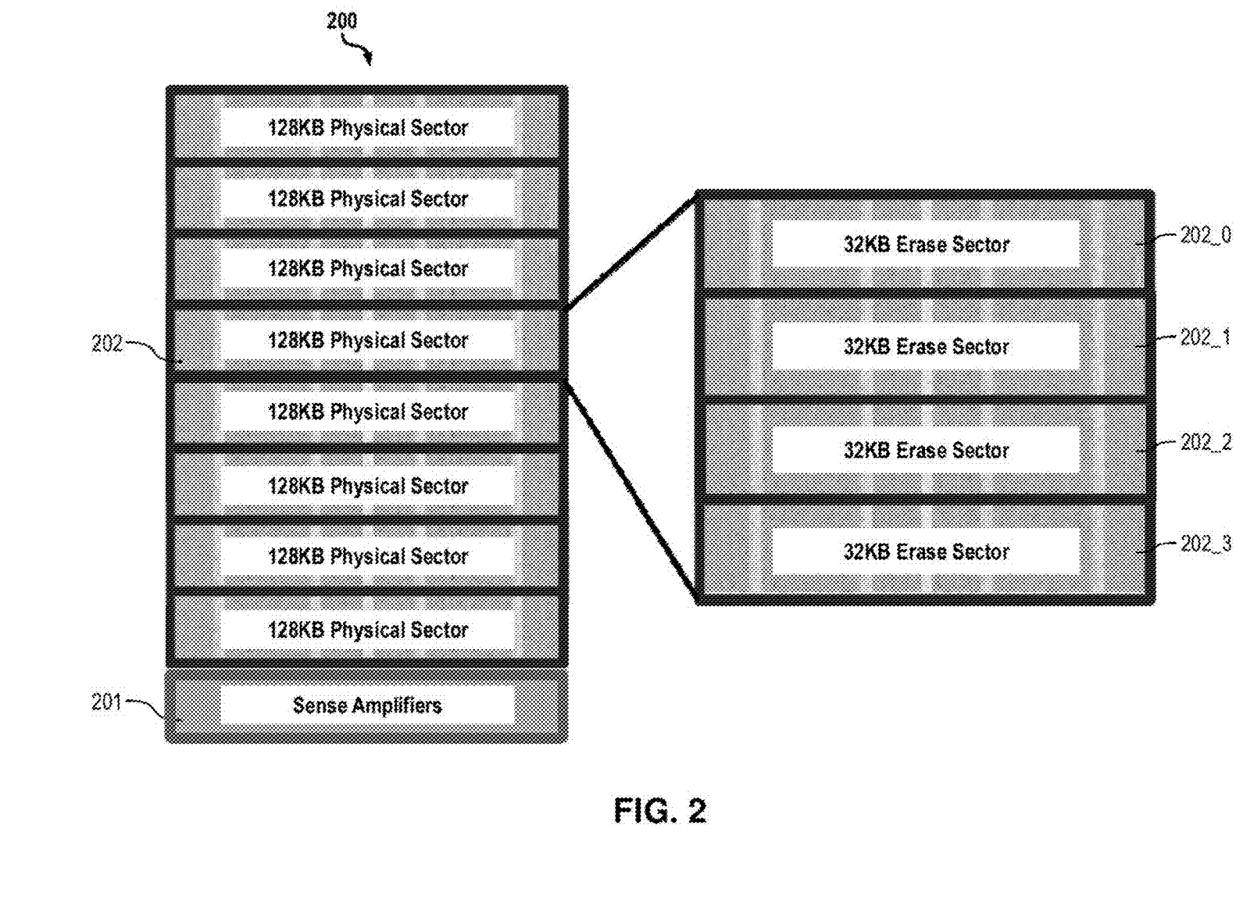
FIG. 2 is a block diagram illustrating an example memory bank of flash memory with no row redundancy.

In accordance with the techniques described herein, an alternative to the conventional solution is to distribute the necessary row-redundancy sector(s) among the normal physical sectors that are used for user data. For example, FIG. 2 illustrates a 1 MB memory bank of flash memory with no row redundancy. In FIG. 2, memory bank 200 includes sense amplifiers 201 that are coupled to eight physical sectors 202 each having 128 KB of flash memory cells. It should be appreciated that while sense amplifiers 201 are illustrated as being disposed at the bottom of memory bank 200, in various architectures the sense amplifiers 201 may occupy different die area(s). For example, in a memory bank that uses ×2 physical sector structures, sense amplifiers 201 may be distributed and disposed between each of the four pairs of physical sectors 202. As illustrated in FIG. 2, each physical sector 202 includes four erase sectors 202_0, 202_1, 202_2, and 202_3, each having 32 KB of flash memory cells.

In order to add row redundancy to the memory bank in FIG. 2, in some embodiments multiple portions of a physical sector, equal in sum to one erase sector of 32 KB of flash memory cells, are distributed within each physical sector. An example of such distributed row redundancy is illustrated in FIG. 3.

Figure 3:
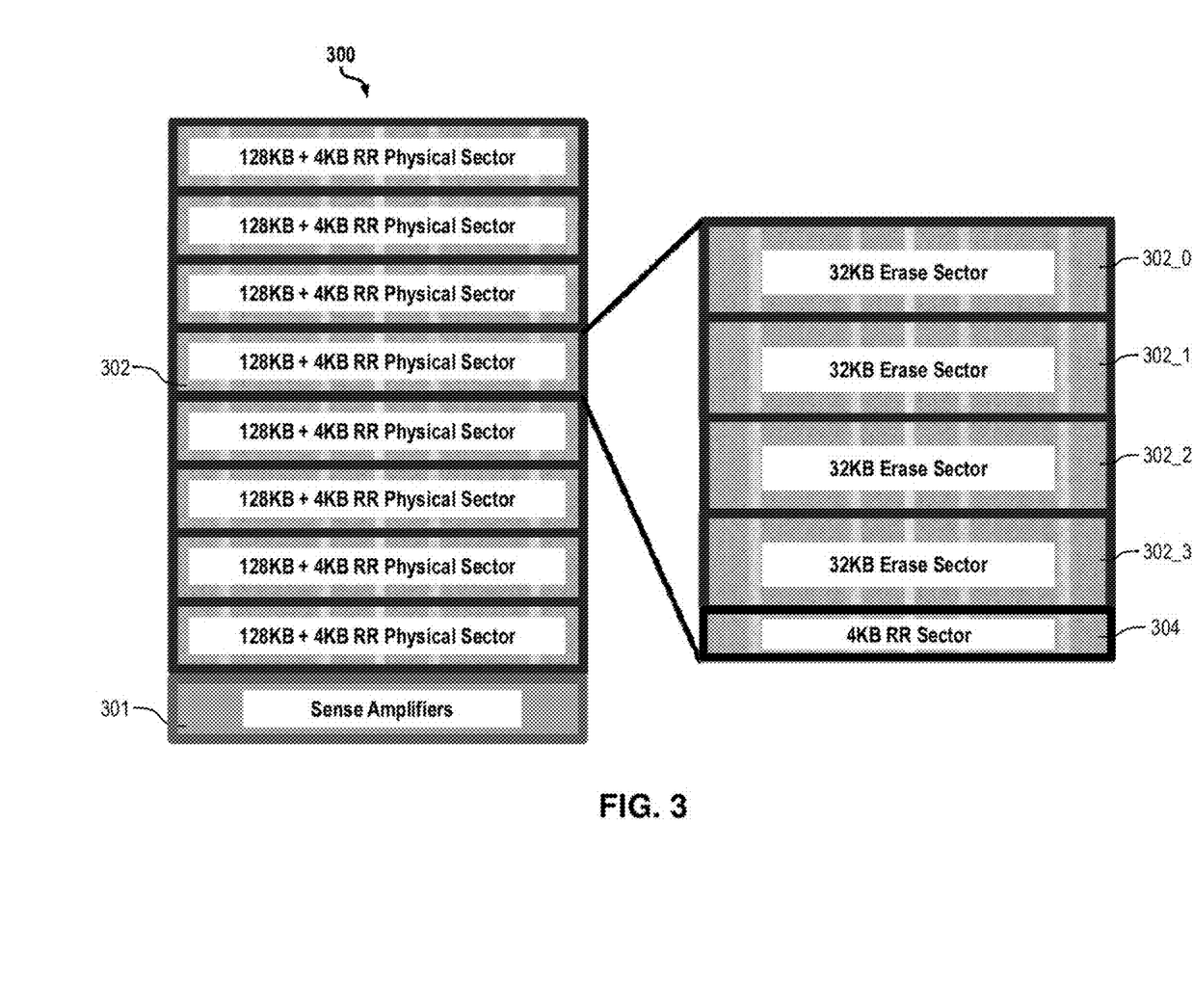
FIG. 3 is a block diagram illustrating an example memory bank of flash memory with distributed row redundancy, according to some embodiments.

In FIG. 3, memory bank 300 includes sense amplifiers 301 that are coupled to eight physical sectors 302, where each physical sector 302 has 128 KB of flash memory cells and a 4 KB portion of the row-redundancy erase sector for the memory bank. It should be appreciated that in various architectures the sense amplifiers 301 may occupy different die area(s). For example, in a memory bank that uses ×2 physical sector structures, sense amplifiers 301 may be distributed and disposed between each of the four pairs of physical sectors 302. Each physical sector 302 includes four erase sectors 302_0, 302_1, 302_2, and 302_3, each having 32 KB of flash memory cells, and a portion 304 of the row-redundancy sector having 4 KB of flash memory cells.

According to the techniques described herein, a bank of flash memory is provided with configuration information for replacement of a defective erase sector with the portions of a row-redundancy sector that is distributed among the normal physical sectors in the memory bank. For example, when a sort flow operation identifies a defective erase sector in the memory bank, the location of the defective sector is recorded in configuration flip-flops, registers, and/or synthesized logic in the memory bank. The configuration flip-flops, registers, and/or synthesized logic may be permanently programmed to store such location information, or may be refreshed with such information upon start-up. Then, based on this location information, memory operations targeted to access the defective sector are instead performed on the row-redundancy sector. For example, internal logic of the X-decoders may use this location information to determine that the target address is directed to memory cells in the defective erase sector, and to decode the target address to indicate a corresponding portion of the distributed row-redundancy sector that is disposed in a normal physical sector. In this manner, the fact that the row redundancy is distributed among multiple normal physical sectors is just a matter of address decoding. Read and program memory operations (which are performed on a single WL basis) are not affected, and erase operations (which are performed on the entire row-redundancy sector) can be performed serially, one location in the normal physical sectors at a time, without imposing any significant performance penalty.

Figure 4:
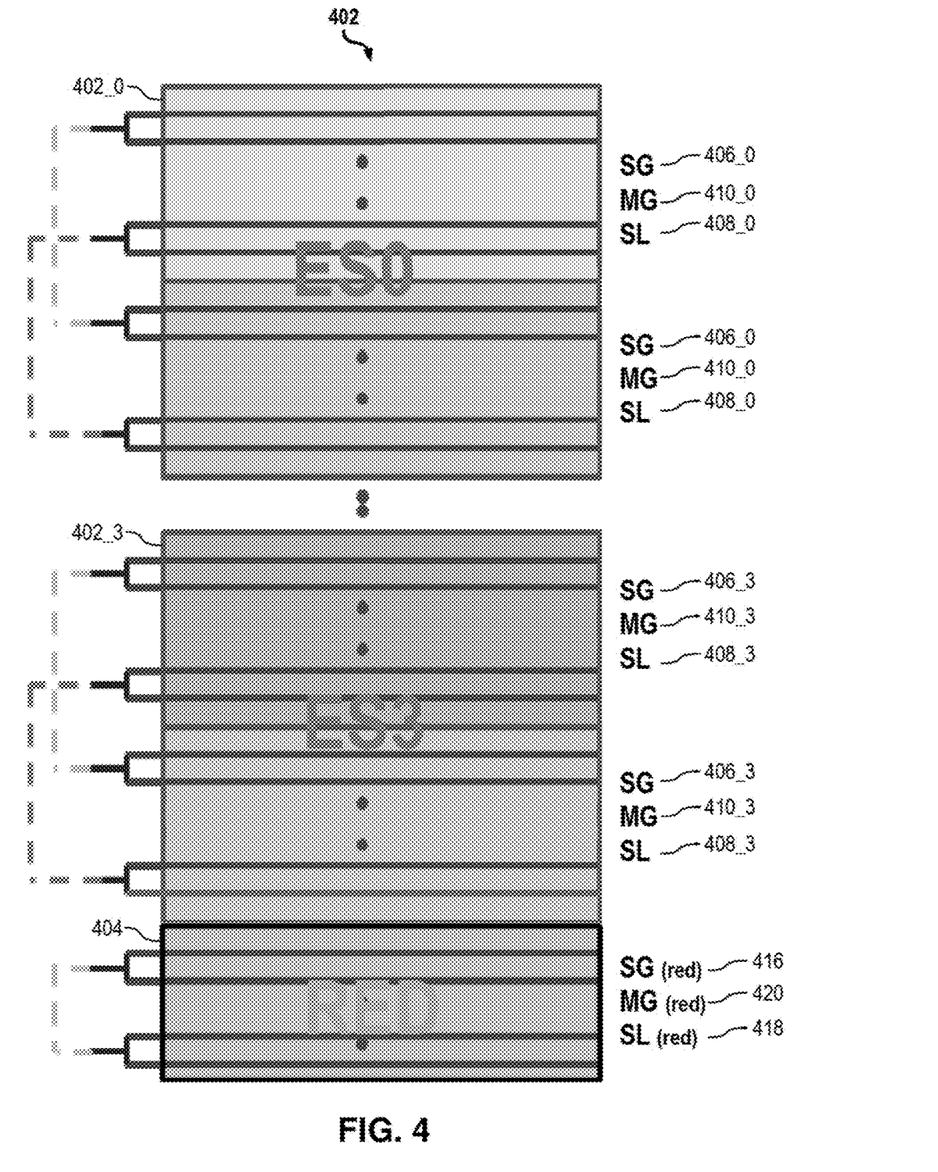
FIG. 4 is a block diagram illustrating the structure of an example physical sector with distributed row redundancy, according to some embodiments.

FIG. 4 is a block diagram illustrating the structure of an example physical sector 402 with distributed row redundancy, according to some embodiments of the techniques described herein. Physical sector 402 includes four erase sectors 402_0 to 402_3, and a portion 404 of a row-redundancy sector. Erase sector 402_0 has disposed therein SG lines 406_0, SLs 408_0, and MG lines 410_0. Erase sector 402_3 has disposed therein SG lines 406_3, SLs 408_3, and MG lines 410_3. The portion 404 of the row-redundancy sector has disposed therein SG lines 416, SLs 418, and MG lines 420. In each of the erase sectors 402_0 to 403_3 and the portion 404 of the row-redundancy sector, the respective SG lines (e.g., 406_0 to 406_3, 416) are coupled to the select gates of core memory cells; the respective SLs (408_0 to 408_3, 418) are coupled to the source regions of the core memory cells; and the respective MG lines (410_0 to 410_3, 420) are coupled to the memory gates of the core memory cells. The core memory cells in physical sector 402 (e.g., in erase sectors 402_0 to 402_3 and in portion 404 of the row-redundancy sector) may be any type of flash memory cells, including without limitation split-gate memory cells, two-transistor (2T) memory cells, NAND memory cells, NOR memory cells, etc.

It should be appreciated that the distributed row redundancy lines (e.g., the SG lines, the SL lines, and the MG lines) in FIG. 4 are a homogenous extension of the lines in physical sector 402, and therefore the area optimization in the physical sector is maximized and the uniformity of the memory arrays therein is preserved. It should also be appreciated that distributing the total amount of row redundancy WLs results in adding to each normal physical sector such a small amount of extra WLs, that it barely has any analog impact (e.g., such as extra capacitance, resistance, etc.) on the physical sectors. This is very efficient with respect to die area and saves the overheads associated with a dedicated redundancy sector. Thus, unlike a conventional row redundancy scheme that uses a dedicated physical sector, the techniques described herein provide an efficient row redundancy scheme (die area wise) with full functionality and reliability, and without any other penalty.

Figure 5:
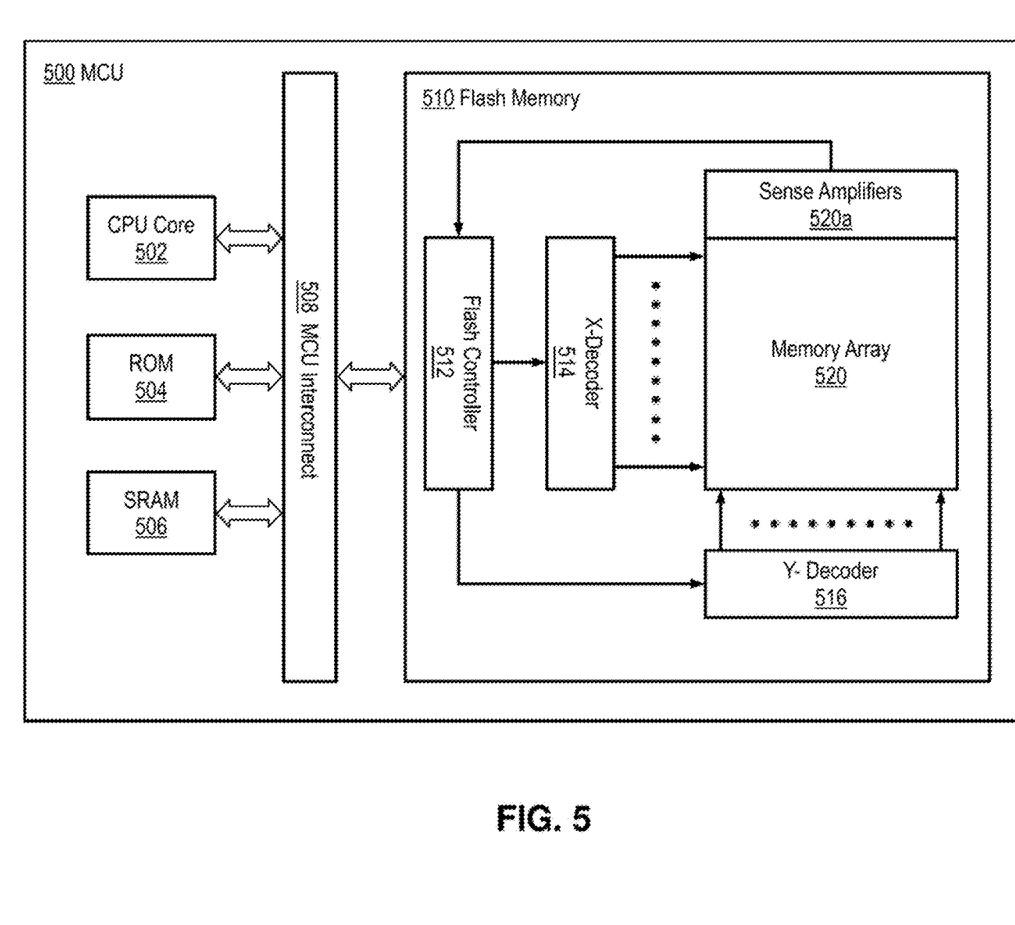
FIG. 5 is a block diagram illustrating an example microcontroller with embedded flash memory, according to some embodiments.

FIG. 5 is a block diagram illustrating an example microcontroller unit (MCU) with embedded flash memory, according to an example embodiment. It should be appreciated that in FIG. 5, MCU 500 has been simplified for the purpose of illustration and is therefore not intended to be a complete description. It should also be appreciated that an MCU may include some, all, or different/additional components than the embodiment in FIG. 5. Further, it should be appreciated that in various embodiments, a semiconductor device other than a MCU—e.g., such as a controller, a special-purpose processor, a digital signal processor ("DSP"), an application specific integrated circuit ("ASIC"), a field programmable gate array ("FPGA"), or the like—may embody the techniques for distributed row redundancy described herein. Thus, MCU 500 in FIG. 5 should be regarded in an illustrative rather than a restrictive sense.

MCU 500 is embodied as an integrated circuit (IC) on a single die of semiconductor substrate. Among other elements, MCU 500 includes central processing unit (CPU) core 502 (which may include one or more processors), read-only memory (ROM) 504, static random access memory (SRAM) 506, and flash memory 510, which are coupled to each other over interconnect 508. It is noted that in various embodiments, different and/or additional elements may be included in the MCU with each choice or type of CPU core, and such elements may be coupled to the CPU core and/or to each other either directly or via bus(es), bridge(s), and/or other circuitry that is different from an interconnect.

CPU core 502 is configured to execute instructions that can be fetched from ROM 504, SRAM 506, flash memory 510, and/or other storage modules (if such are configured). ROM 504 is programmed as firmware to store instructions and/or data (e.g., such as configuration data) that can be accessed by CPU core 502 and other elements of MCU 500. SRAM 506 is a volatile memory device configured to store data and/or instructions without the need to be refreshed (as long as the power is applied thereto), and can be written to or read from in any order, regardless of the last memory location that was accessed. Interconnect 508 is configured to provide address, data, and control interface between CPU 502 and the other MCU elements.

Flash memory 510 is an embedded non-volatile memory (NVM) memory device that can store data, configuration information, and/or executable instructions. Flash memory 510 is coupled to interconnect 508 (e.g., via an address, data and control buses) and is configured to receive information therefrom and to send information thereto. Among other elements, flash memory 510 includes flash controller 512, X-decoder 514, Y-decoder 516, and memory array 520. Flash controller 512 is configured with various hardware components (e.g., transistors, logic gates, and various other analog and/or digital circuits) to provide state and command control for flash memory 510. For example, flash controller 512 is coupled to receive signals from various control lines and buses, to send control and command signals (e.g., to X-decoder 514, Y-decoder 516, etc.), and to control signals applied to memory array 520 during various memory operations.

Memory array 520 is an array of flash memory cells arranged as rows and columns, such that each memory cell can be accessed by row and column address through row and column driver circuits. A memory cell may store one or more bits of information in its memory transistor(s) that can be accessed in read, program, and erase operations. In the embodiment of FIG. 5, the memory cells in memory array 520 are disposed in multiple physical sectors that may be arranged as one or more memory banks, and each physical sector may include a number of rows and columns of memory cells.

Memory array 520 is coupled to X-decoder 514 via select gate lines, source lines, and memory gate lines, among other MCU elements. Memory array 520 is also coupled to Y-decoder 516 via multiple bit lines, among other MCU elements. X-decoder 514 and Y-decoder 516 include circuitry configured to receive address information from flash controller 512 during memory operations, and to decode the address information to determine the corresponding memory cell(s). For example, among other circuitry, X-decoder 514 includes SG drivers, SL drivers, MG drivers, and various peripheral circuitry (e.g., such as charge pumps, digital-to-analog converters, amplifiers, etc.) that are operable to identify the addressed row(s) of memory cells during memory operations. Y-decoder 516 includes, among other circuitry, bit line drivers and various peripheral circuitry that operate to identify the addressed column(s) of memory cells during memory operations.

Memory array 520 includes sense amplifiers 520a. It is noted that in various architectures sense amplifiers 520a may occupy different die area(s) of the memory array 520. For example, in embodiments that use ×2 physical sector structures, the sense amplifiers may be disposed between each pair of physical sectors in the memory array. During memory operations, sense amplifiers 520a are configured to read multi-bit words from the memory cells in the memory array and to transfer the multi-bit words to circuitry (e.g., latches, data buffers, etc.) that is controlled by flash controller 512.

In a read memory operation, a bit stored in memory array 520 is read from an address specified in the read operation. The address information is passed from flash controller 512 and is decoded by X-decoder 514 and Y-decoder 516 to determine the corresponding memory cell. As an example for current-based sensing, to read a bit stored at the decoded address, a voltage is applied to the memory gate of the corresponding memory cell. The voltage is precisely generated so that it lies substantially equidistant between the target voltage necessary to turn on the memory transistor when storing a "high" bit and the target voltage necessary to turn on the transistor when storing a "low" bit, in order to clearly distinguish between two states. If the application of the voltage during the read operation causes a sense amplifier 520a to detect a flow of substantial current between the source and the drain of the memory cell which is equivalent to the target current range, then the memory cell holds a "high" bit. Alternatively, if the application of the voltage during the read operation does not cause the sense amplifier 520a to detect a flow of substantial current between the source and the drain of the memory cell equivalent to the target current range, then the memory cell holds a "low" bit.

In a program memory operation, a bit stored in memory array 520 is written to an address specified in the program operation. The address information is passed to and decoded by X-decoder 514 and Y-decoder 516 to determine the corresponding memory cell. A positive voltage is applied to the select gate of the memory cell, while a higher positive voltage is applied to its memory gate. The bias conditions between the memory gate and the source of the memory cell effectively programs a "low" bit within the memory transistor of the memory cell, which continues to be stored even after the various voltages are removed.

In an erase memory operation, the bits stored in the memory cells of a given erase sector of memory array 520 are erased based on address information specified in the erase operation. The address information is passed to and decoded by X-decoder 514 and Y-decoder 516 to determine the location of the targeted erase sector. In order to "erase" any charge that may be stored within the memory transistor of a memory cell and return its state to a "high" bit, a precise voltage is applied to the source of the memory cell. The drain of the memory cell is floated (or held at a certain bias), a precisely generated high negative voltage is applied to its memory gate, and its select gate is grounded. The bias conditions between the memory gate and the source of the memory cell effectively erases the memory transistor to the "high" bit state.

In accordance with the techniques for row-redundancy described herein, a defective erase sector is identified during a sort flow operation. The defective erase sector is then replaced in flash memory 520 with a distributed row-redundancy sector, e.g., by programming/storing the location information of the defective sector in configuration flip-flops, registers, and/or other logic. In use, when a read or program memory operation is initiated for an address in the defective erase sector, X-decoder 514 decodes the address to identify a row of memory cells in a corresponding portion of the distributed row-redundancy sector. The normal physical sector corresponding to the identified row is determined and the requested data is read from or programmed into the portion of the row-redundancy sector that is disposed within the physical sector. When an erase operation is initiated against the defective erase sector, X-decoder 514 decodes the address in the erase operation and determines that it needs to erase the memory cells in the distributed row-redundancy sector. Control logic (e.g., in flash controller 512) then applies the necessarily voltages serially, or in parallel, to each portion of the row-redundancy sector that is disposed in each of the physical sectors, thereby erasing the memory cells in the distributed row-redundancy sector.

In various embodiments, use of the distributed row redundancy scheme described herein results in overall reduction of the die area used for a flash memory product. The distributed redundancy scheme improves the manufacturing yield and overcomes the effects of row-related manufacturing defects. For example, the row redundancy scheme described herein provides for adding row-redundancy word lines, source lines, and memory gate lines to multiple physical sectors of a memory bank, thereby distributing the necessary redundancy among normal physical sectors instead of using a separate redundant sector. This allows for disposing the logic (e.g., configuration flop-flops, registers, synthesized logic, driver circuits, etc.) necessary to operate the row-redundancy lines as part of, or along with, the similar logic that is used to operate the normal physical sectors. It should be appreciated that the row redundancy scheme described herein is particularly useful for non-volatile memory architectures (e.g., such as embedded flash memory) that require fast access but need to avoid a large die-area penalty. One example of such architectures is a flash memory architecture that is used in automotive semiconductor products, which generally require high manufacturing yields with low defective rates and low die area impacts.

Various embodiments of the techniques described herein for distributed row redundancy in flash memory may include various operations. These operations may be performed by hardware components, firmware, or a combination thereof. As used herein, the terms "coupled to" and "coupled with" mean coupled directly or coupled indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Although the operations of any method(s) herein may be shown and described in a particular order, the order of the operations of each method may be altered so that certain operations may be performed in an inverse order or so that certain operation may be performed, at least in part, concurrently with other operations. In other embodiments, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A semiconductor device comprising:
    an embedded flash memory comprising a memory bank that includes multiple physical sectors, wherein each physical sector comprises a plurality of erase sectors, and wherein:
        multiple portions of an additional erase sector are respectively distributed among the multiple physical sectors; and
        the multiple portions of the additional erase sector are configured as a row-redundancy sector for the memory bank.

2. The semiconductor device of claim 1, wherein:
    the memory bank includes a defective erase sector; and
    the multiple portions of the additional erase sector are configured to replace the defective erase sector within the memory bank.

3. The semiconductor device of claim 2, wherein the embedded flash memory is configured to access the multiple portions of the additional erase sector, instead of the defective erase sector, during a memory operation on the memory bank.

4. The semiconductor device of claim 3, wherein the memory operation is a read operation or a program operation.

5. The semiconductor device of claim 3, wherein the memory operation is an erase operation that is performed serially on the multiple physical sectors to erase each of the multiple portions of the additional erase sector.

6. The semiconductor device of claim 3, wherein the memory operation is an erase operation that is performed in parallel on the multiple physical sectors to erase each of the multiple portions of the additional erase sector.

7. THE semiconductor device of claim 2, wherein the defective erase sector is determined during a sort flow operation on the embedded flash memory.

8. The semiconductor device of claim 1, wherein the semiconductor device comprises:

first word lines (WLs) coupled to first memory cells in the multiple physical sectors; and second WLs distributed among the multiple physical sectors in addition to the first WLs, wherein the second WLs are coupled to second memory cells in the multiple portions of the additional erase sector.

9. The semiconductor device of claim 1, wherein in addition to the multiple physical sectors, the memory bank comprises one or more physical sectors that do not include a portion of the additional erase sector.

10. A system comprising:

a microcontroller unit; and a flash memory embedded within the microcontroller unit, the flash memory comprising a memory bank that includes multiple physical sectors, wherein each physical sector comprises a plurality of erase sectors, and wherein:

multiple portions of an additional erase sector are respectively distributed among the multiple physical sectors; and the multiple portions of the additional erase sector are configured as a row-redundancy sector for the memory bank.

11. The system of claim 10, wherein:

the memory bank includes a defective erase sector; and the multiple portions of the additional erase sector are configured to replace the defective erase sector within the memory bank.

12. The system of claim 11, wherein the flash memory is configured to access the multiple portions of the additional erase sector, instead of the defective erase sector, during a memory operation on the memory bank.

13. The system of claim 12, wherein the memory operation is a read operation or a program operation.

14. The system of claim 12, wherein the memory operation is an erase operation that is performed serially on the multiple physical sectors to erase each of the multiple portions of the additional erase sector.

15. The system of claim 12, wherein the memory operation is an erase operation that is performed in parallel on the multiple physical sectors to erase each of the multiple portions of the additional erase sector.

16. A method of configuring embedded flash memory with row redundancy, the method comprising:

providing first word lines (WLs) disposed in multiple physical sectors of a memory bank in the embedded flash memory, wherein each physical sector comprises a plurality of erase sectors; and providing second WLs disposed within the multiple physical sectors in addition to the first WLs, wherein the second WLs are coupled to multiple portions of an additional erase sector that are respectively distributed among the multiple physical sectors, and wherein the additional erase sector is configured as a row-redundancy sector for the memory bank.

17. The method of claim 16, further comprising:

determining that the memory bank includes a defective erase sector; and configuring the embedded flash memory to replace the defective erase sector with the multiple portions of the additional erase sector in the memory bank.

18. The method of claim 17, further comprising configuring the embedded flash memory for a memory operation that is to access the multiple portions of the additional erase sector instead of the defective erase sector.

19. The method of claim 18, wherein the memory operation is a read operation or a program operation.

20. The method of claim 17, further comprising configuring the embedded flash memory for an erase operation that is to be performed serially on the multiple physical sectors to erase each of the multiple portions of the additional erase sector.

* * * * *